(12) United States Patent
Lin et al.

(10) Patent No.: US 8,900,937 B2
(45) Date of Patent: Dec. 2, 2014

(54) FINFET DEVICE STRUCTURE AND METHODS OF MAKING SAME

(71) Applicant: Taiwan Semiconductor Manufacturing Company, Ltd., Hsin-Chu (TW)

(72) Inventors: Yu-Chao Lin, Hsin-Chu (TW); Cheng-Han Wu, Kaohsiung (TW); Eric Chih-Fang Liu, Taipei (TW); Ryan Chia-Jen Chen, Chiaya (TW); Chao-Cheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 12 days.

(21) Appl. No.: 13/826,310

(22) Filed: Mar. 14, 2013

(65) Prior Publication Data
US 2014/0256093 A1    Sep. 11, 2014

Related U.S. Application Data

(60) Provisional application No. 61/776,727, filed on Mar. 11, 2013.

(51) Int. Cl.
*H01L 21/84* (2006.01)
*H01L 29/66* (2006.01)

(52) U.S. Cl.
CPC .................... *H01L 29/66795* (2013.01)
USPC ........................................................ 438/157

(58) Field of Classification Search
CPC .................... H01L 27/102; H01L 21/823431; H01L 29/20
USPC ............ 257/67, 288, 390, E21.111–E21.115, 257/E21.619–E21.635; 438/157, 197, 438/149–155; 216/73, 95–109, 40–51; 700/46, 95, 121, 117, 125
See application file for complete search history.

(56) References Cited

U.S. PATENT DOCUMENTS

| | | | |
|---|---|---|---|
| 5,811,358 A * | 9/1998 | Tseng et al. | 438/725 |
| 6,713,392 B1 | 3/2004 | Ngo et al. | |
| 6,794,313 B1 | 9/2004 | Chang | |
| 7,387,973 B2 | 6/2008 | Wang et al. | |
| 8,546,202 B2 * | 10/2013 | Tung et al. | 438/151 |
| 2007/0049040 A1 * | 3/2007 | Bai et al. | 438/712 |
| 2008/0041813 A1 * | 2/2008 | Oladeji et al. | 216/13 |
| 2009/0101995 A1 * | 4/2009 | Beintner et al. | 257/412 |
| 2009/0309152 A1 * | 12/2009 | Knoefler et al. | 257/324 |
| 2010/0155844 A1 * | 6/2010 | Takahashi | 257/348 |
| 2011/0053361 A1 * | 3/2011 | Muralidhar et al. | 438/585 |
| 2011/0248382 A1 * | 10/2011 | Pellizzer et al. | 257/539 |
| 2012/0037877 A1 * | 2/2012 | Breitwisch et al. | 257/3 |
| 2012/0252221 A1 * | 10/2012 | De Brabander et al. | 438/736 |
| 2012/0286364 A1 * | 11/2012 | Cheng et al. | 257/369 |
| 2013/0253690 A1 * | 9/2013 | Fukumura | 700/121 |

* cited by examiner

*Primary Examiner* — Julio J Maldonado
*Assistant Examiner* — Sheikh Maruf
(74) *Attorney, Agent, or Firm* — Slater & Matsil, LLP

(57) ABSTRACT

Embodiments of the present disclosure are a method of forming a semiconductor device and a method of forming a FinFET device. An embodiment is a method of forming a semiconductor device, the method including forming a first dielectric layer over a substrate, forming a first hardmask layer on the first dielectric layer, and patterning the first hardmask layer to form a first hardmask portion with a first width. The method further includes forming a second dielectric layer on the first dielectric layer and the first hardmask portion, forming a third dielectric layer on the second dielectric layer, and etching the third dielectric layer and a portion of the second dielectric layer to form a first and second spacer on opposite sides of the first hardmask portion.

22 Claims, 16 Drawing Sheets

FINFET DEVICE STRUCTURE AND METHODS OF MAKING SAME

This application claims priority to U.S. Provisional Application No. 61/776,727, filed on Mar. 11, 2013, and entitled "FinFET Device Structure and Methods of Making Same," which application is incorporated herein by reference.

BACKGROUND

Transistors are key components of modern integrated circuits. To satisfy the requirements of increasingly faster speed, the drive currents of transistors need to be increasingly greater. Since the drive currents of transistors are proportional to gate widths of the transistors, transistors with greater widths are preferred.

The increase in gate widths, however, conflicts with the requirements of reducing the sizes of semiconductor devices. Fin field-effect transistors (FinFET) were thus developed.

The introduction of FinFETs has the advantageous feature of increasing drive current without the cost of occupying more chip area. However, the small size of FinFET transistors raises numerous issues during their production and manufacturing.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
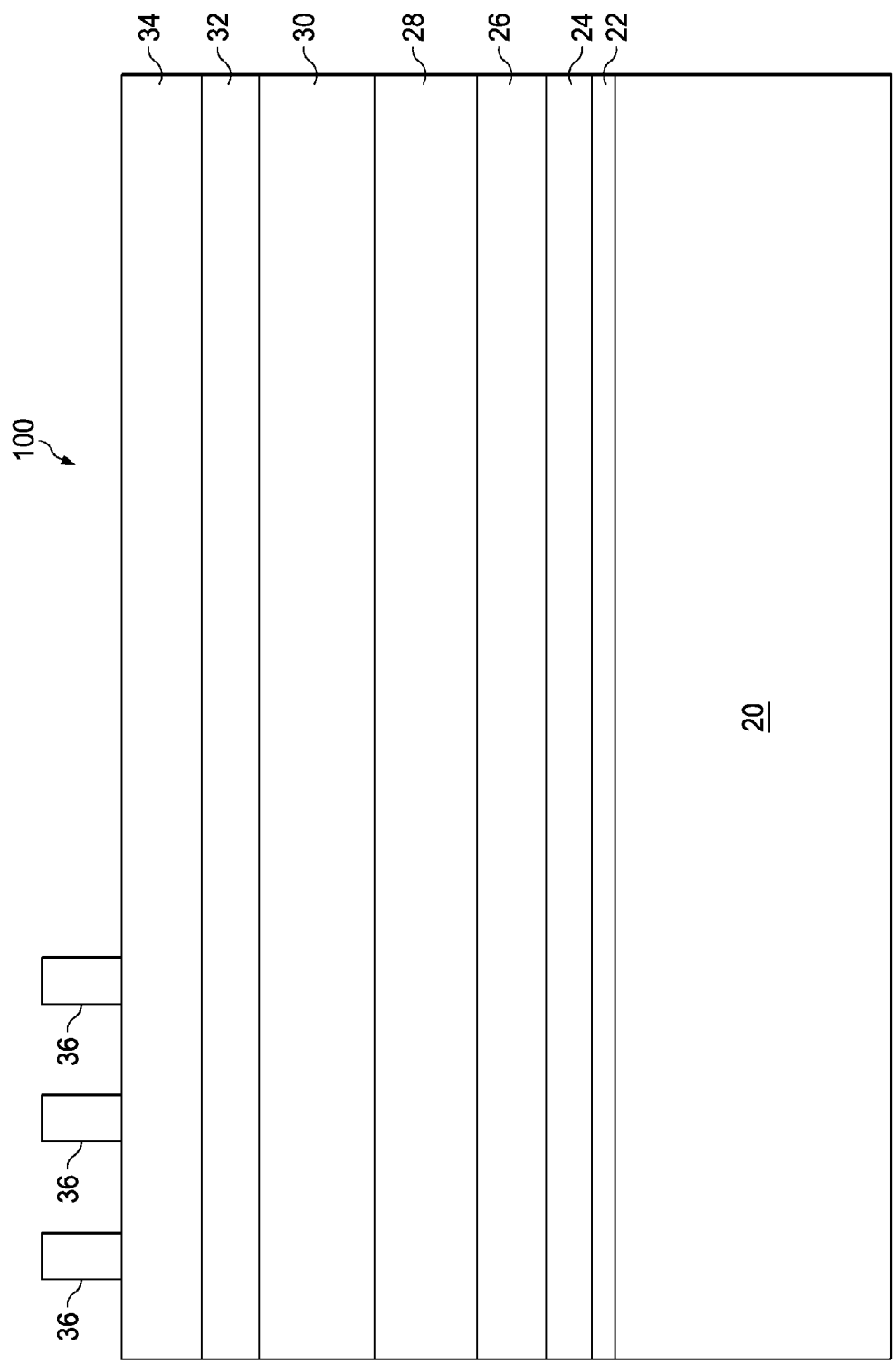
FIG. 1 illustrates a substrate with a first dielectric layer, a second dielectric layer, a third dielectric layer, a first hardmask layer, an APF layer, a second hardmask layer, and a BARC layer in accordance with an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a spacer mask for a FinFET device. Other embodiments may also be applied, however, to other spacer masks for other types of devices.

Figure 15:
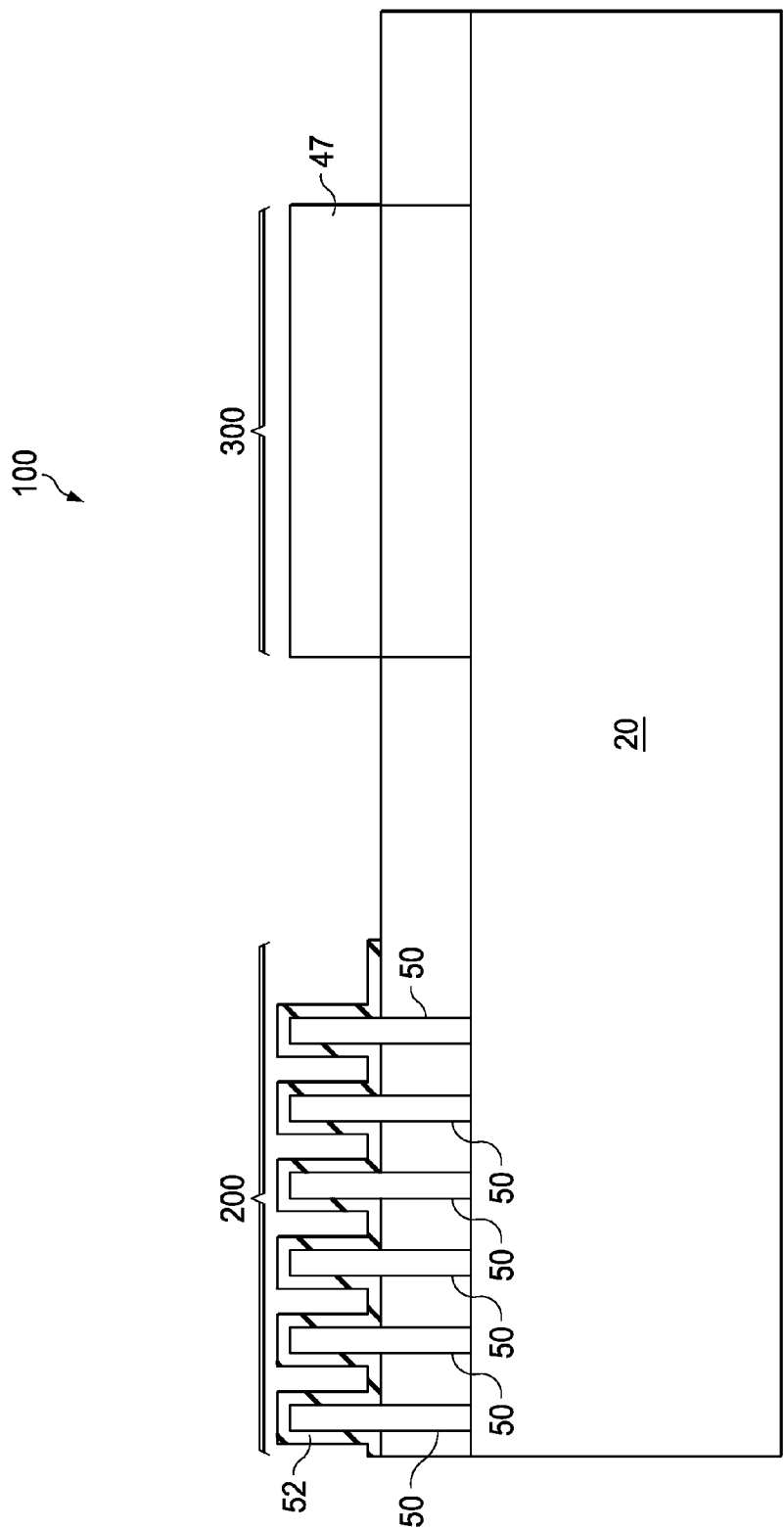
FIG. 15 illustrates a formation of a seventh dielectric layer and a gate in accordance with an embodiment.
Figure 16:
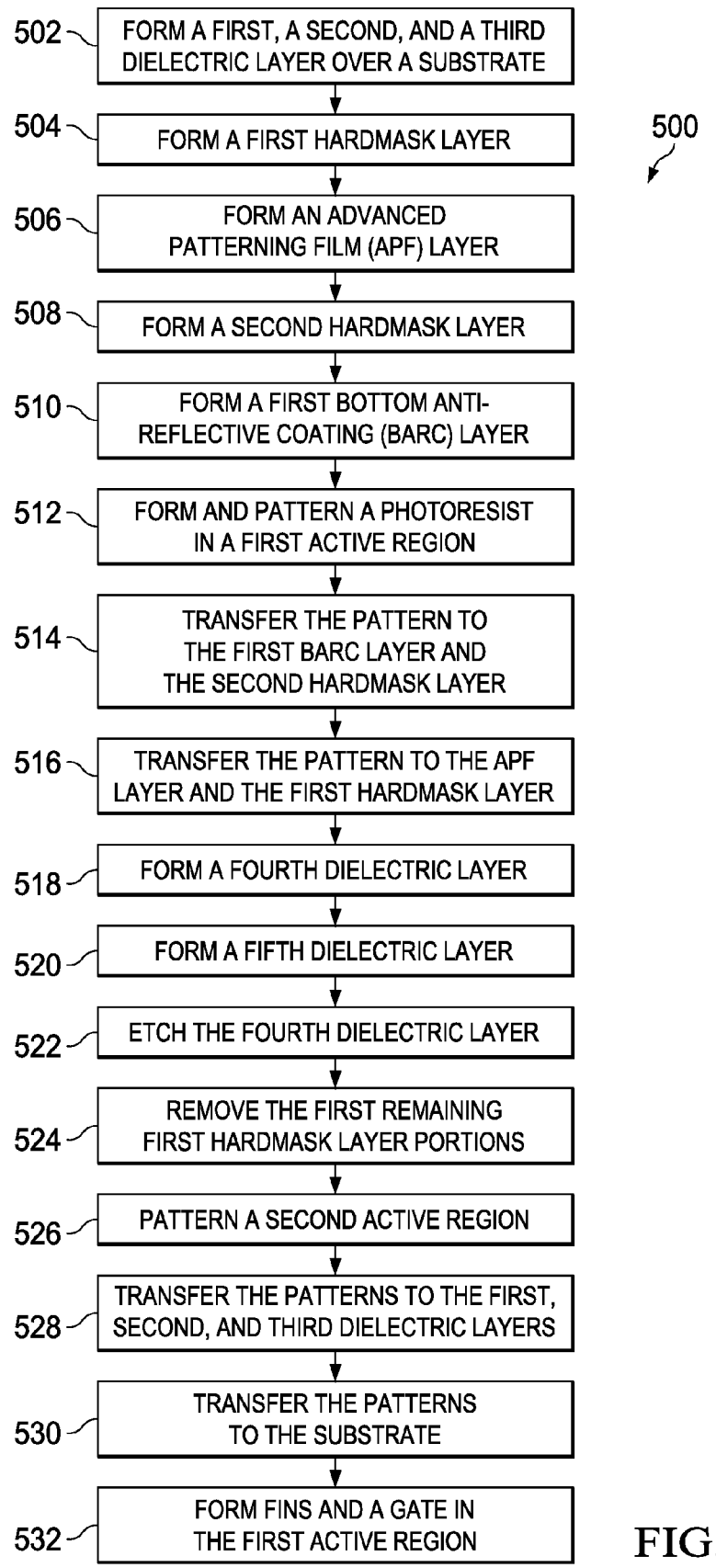
FIG. 16 illustrates a flow diagram of a method for manufacturing a FinFET device according to an embodiment.

FIGS. 1 through 15 are cross-sectional views of intermediate stages in the manufacturing of a FinFET in accordance with an embodiment, and FIG. 16 is a process flow of the process shown in FIGS. 1 through 15.

With reference to FIG. 1, there is shown a cross-sectional view of a FinFET device 100 at an intermediate stage of processing. The FinFET device 100 includes a substrate 20, a first dielectric layer 22, a second dielectric layer 24, a third dielectric layer 26, a first hardmask layer 28, an advanced patterning film (APF) layer 30, a second hardmask layer 32, a first bottom anti-reflective coating (BARC) layer 34, and a first photoresist 36 over the substrate 20. The substrate 20 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 20 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 20 may be doped with a p-type dopant, such as boron, aluminum, gallium, or the like, although the substrate may alternatively be doped with an n-type dopant, as is known in the art.

The substrate 20 may include active and passive devices (not shown in FIG. 1). As one of ordinary skill in the art will recognize, a wide variety of devices such as transistors, capacitors, resistors, combinations of these, and the like may be used to generate the structural and functional requirements of the design for the FinFET device 100. The devices may be formed using any suitable methods. Only a portion of the substrate 20 is illustrated in the figures, as this is sufficient to fully describe the illustrative embodiments.

The first dielectric layer 22 may be deposited over the substrate 20 (step 502). The first dielectric layer 22 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first dielectric layer 22 may be deposited through a process such as chemical vapor deposition (CVD), or a spin-on-glass process, although any acceptable process may be utilized to form the first dielectric layer 22 to a thickness between about 30 Å to about 90 Å. In an embodiment, the first dielectric layer 22 may be used as an etch stop layer (ESL) for subsequent processes.

The second dielectric layer 24 may be deposited over the first dielectric layer 22 (step 502). The second dielectric layer 24 may be formed of similar materials and similar processes as the first dielectric layer 22, although the first dielectric layer 22 and the second dielectric layer 24 need not be the same material. In an embodiment, the second dielectric layer 24 may be formed to a thickness between about 300 Å to about 600 Å.

The third dielectric layer 26 may be deposited over the second dielectric layer 24 (step 502). The third dielectric layer 26 may be used as an ESL for subsequent processes and may be formed of similar materials and similar processes as the first dielectric layer 22 and the second dielectric layer 24, although the first dielectric layer 22, the second dielectric layer 24, and the third dielectric layer 26 need not be the same materials. In an embodiment, the third dielectric layer 26 may be formed to a thickness between about 300 Å to about 700 Å. In some embodiments, the first dielectric layer 22, the second dielectric layer 24, and the third dielectric layer 26 may be a single dielectric layer rather than three separate layers.

The first hardmask layer 28 may be formed over the third dielectric layer 26 (step 504). The first hardmask layer may be a masking material such as poly-silicon, silicon nitride, the like, or a combination thereof and may be formed using a process such as plasma enhanced chemical vapor deposition (PECVD). However, any other suitable hardmask material, such as silicon oxide, and any other process of formation, such as CVD, may alternatively be utilized. In an embodiment the first hardmask layer 28 may be formed to a thickness of between about 800 Å and about 1500 Å.

The APF layer 30 may be formed over the first hardmask layer 28 (step 506) and may be utilized for critical dimension control in order to obtain and control the desired dimensions of the patterning of the first hardmask layer 28 (not shown in FIG. 1 but illustrated and discussed below with respect to FIG. 4). In an embodiment the APF layer 30 may comprise amorphous carbon formed by a CVD process, although other suitable materials and methods of formation may alternatively be utilized. The APF layer 30 may be formed to a thickness of between about 700 Å and about 1200 Å.

The second hardmask layer 32 may be formed over the APF layer 30 (step 508) and may be utilized to help pattern the APF layer 30, and may be a masking material such as silicon oxynitride, although other suitable materials, such as silicon oxide or silicon nitride, may alternatively be utilized, and may be formed a process such as CVD. However, any other suitable processes and thicknesses may alternatively be utilized. In an embodiment the second hardmask layer 32 may be formed to a thickness of between about 150 Å and about 400 Å.

The first BARC layer 34 may be formed over the second hardmask layer 32 (step 510). The first BARC layer 34 prevents radiation in a subsequent photolithographic process to reflect off layers below and interfering with the exposure process. Such interference can increase the critical dimension of the photolithography process. The first BARC layer 34 may comprise SiON, a polymer, the like, or a combination thereof and may be formed by CVD, a spin-on process, the like, or a combination thereof within a lithography tool track. In an embodiment the first BARC layer 34 may be formed to a thickness of between about 400 Å and about 800 Å.

A first photoresist 36 may be deposited and patterned over the first BARC layer 34 (step 512). Although FIG. 1 illustrates three separate sections of the first photoresist 36, there may be more or less sections depending on the number of semiconductor strips 49 and fins 50 (see FIGS. 14 and 15) that are desired. The first photoresist 36 may comprise a conventional photoresist material, such as a deep ultra-violet (DUV) photoresist, and may be deposited on the surface of the first BARC layer 34, for example, by using a spin-on process to place the first photoresist 36. However, any other suitable material or method of forming or placing the first photoresist 36 may alternatively be utilized. Once the first photoresist 36 has been placed on the first BARC layer 34, the first photoresist 36 may be exposed to energy, e.g. light, through a patterned reticle in order to induce a reaction in those portions of the first photoresist 36 exposed to the energy. The first photoresist 36 may then be developed, and portions of the first photoresist 36 may be removed, exposing a surface of the first BARC layer 34.

Figure 2:
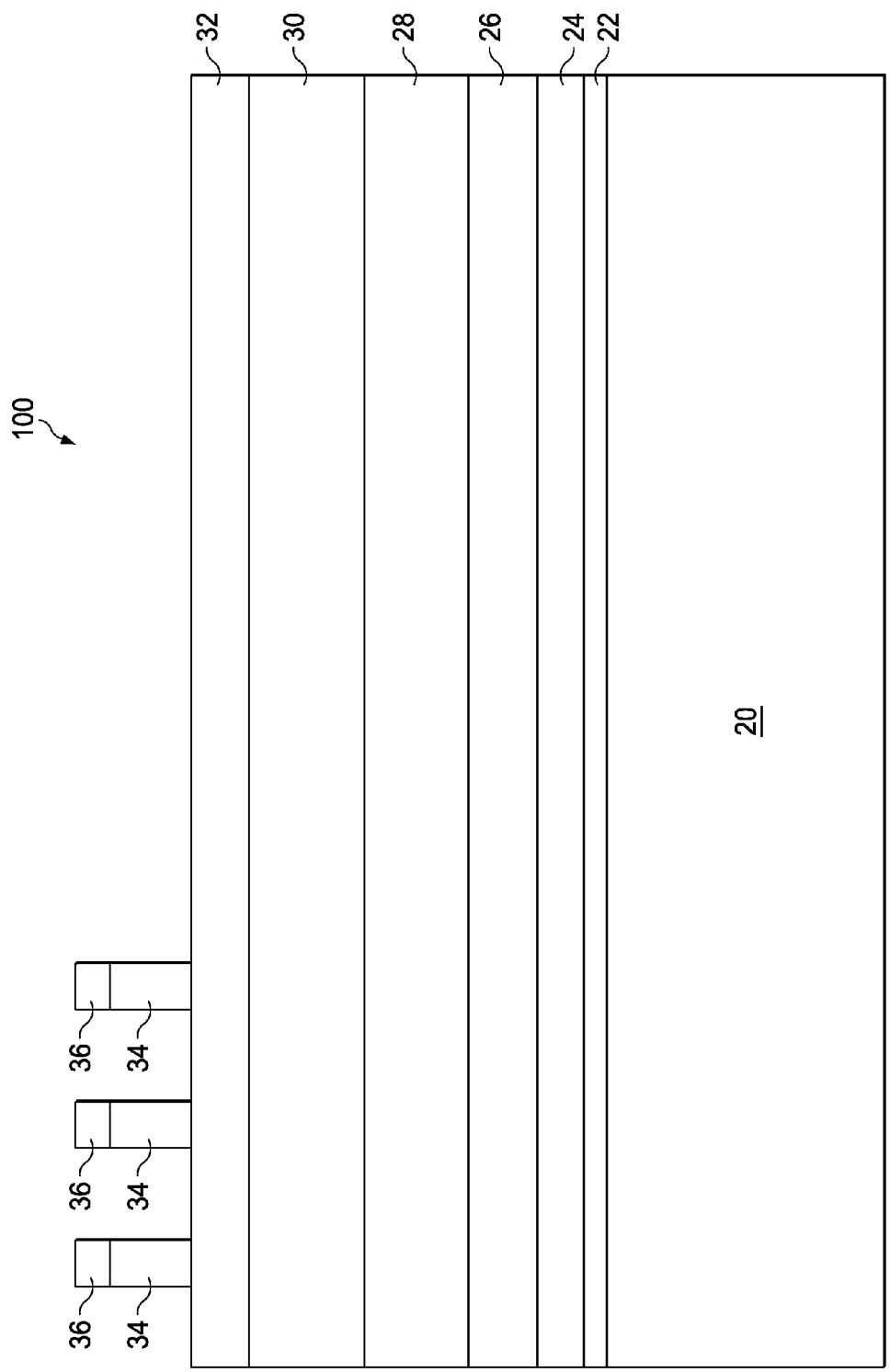
FIG. 2 illustrates a patterning of the BARC layer in accordance with an embodiment.
Figure 3:
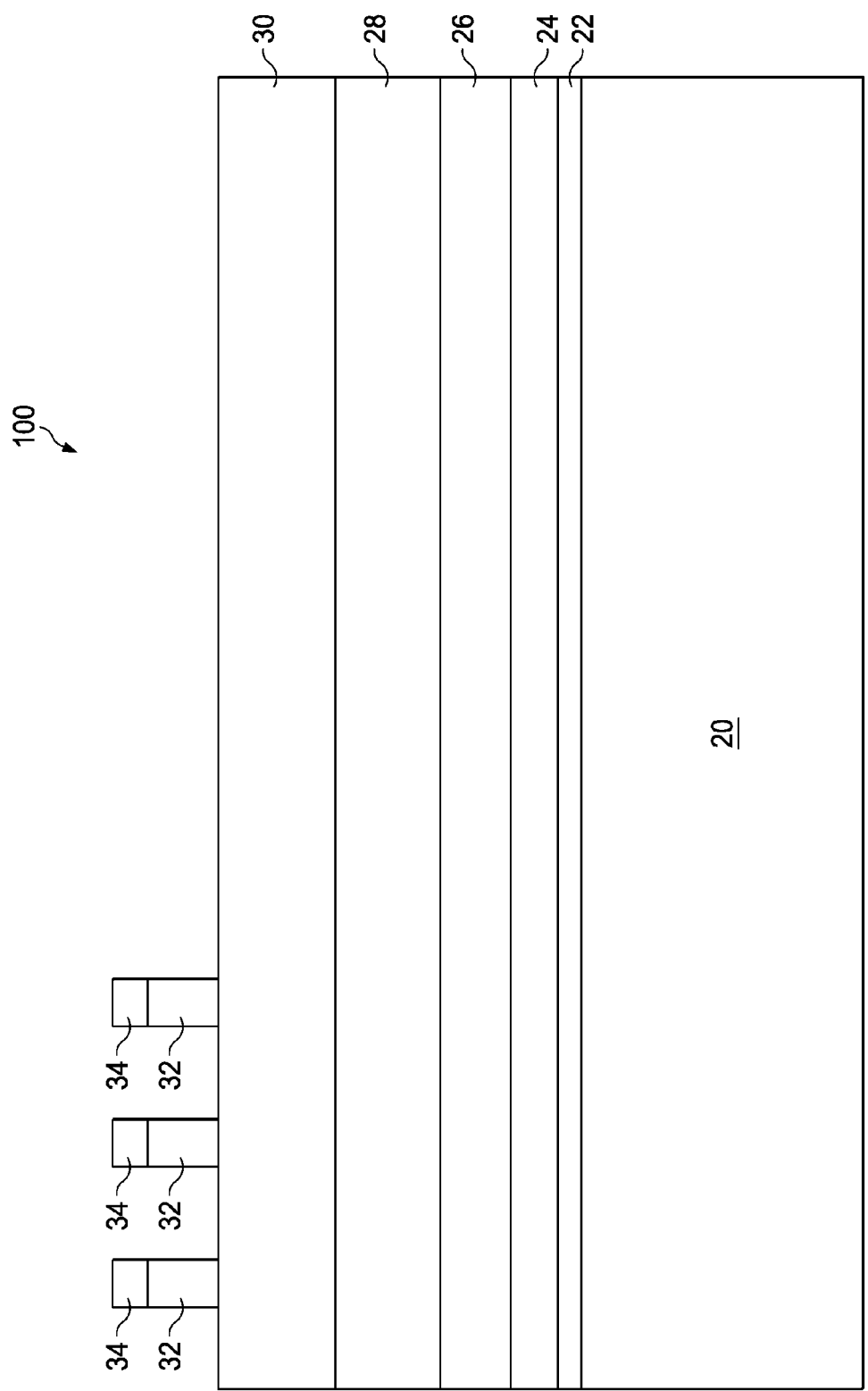
FIG. 3 illustrates a patterning of the second hardmask layer in accordance with an embodiment.

After developing and removing a portion of the first photoresist 36, an etch step is further performed into the first BARC layer 34 to remove the exposed portions, thereby patterning the BARC layer 34 as illustrated in FIG. 2. Once the first BARC layer 34 has been patterned, the pattern may be transferred to the second hardmask layer 32 as illustrated in FIG. 3 (step 514).

Figure 4:
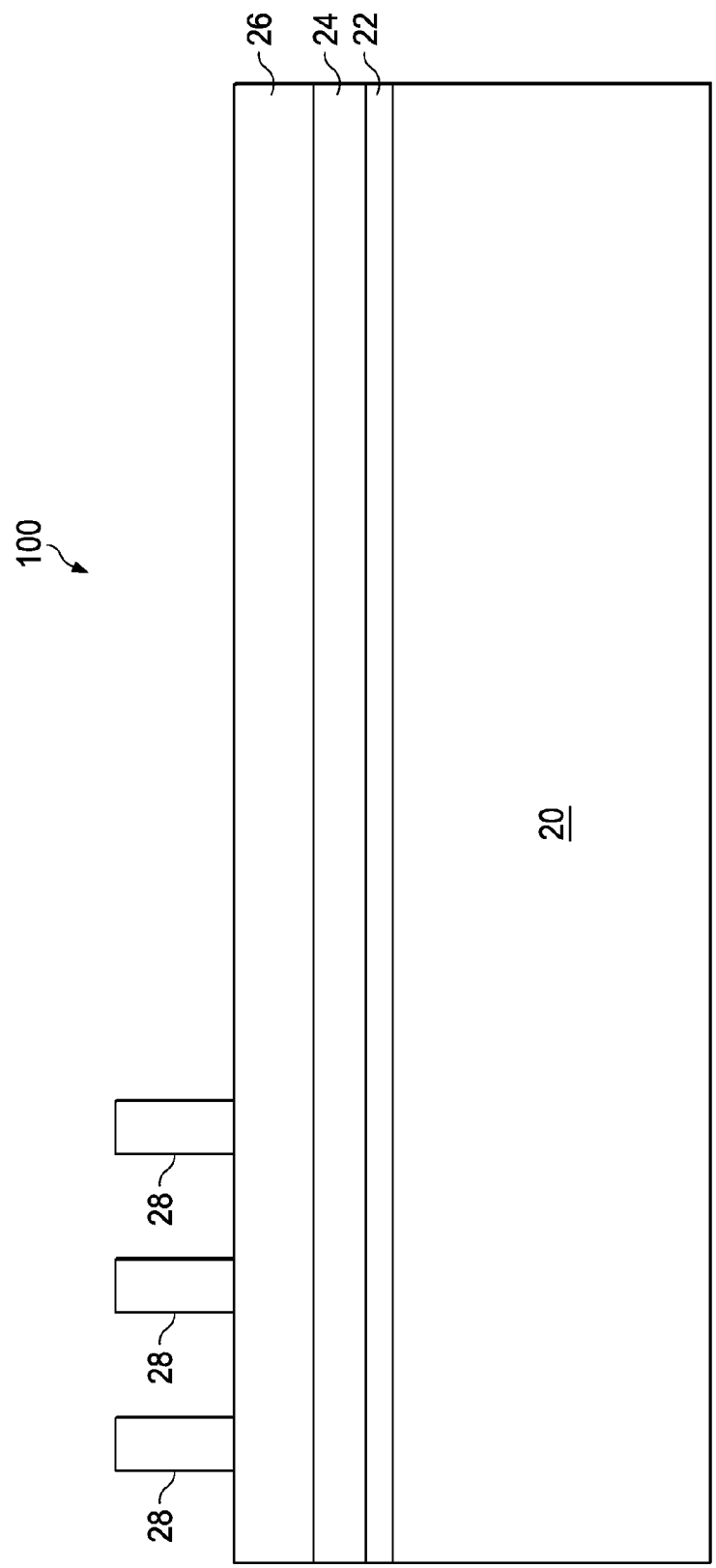
FIG. 4 illustrates a patterning of the APF layer and the first hardmask layer in accordance with an embodiment.

FIG. 4 illustrates the resulting structure after the pattern has been transferred to the APF layer 30 and the first hardmask layer 28 (step 516). The pattern may be transferred to the APF layer 30 using, e.g., a dry etch using a mixture of H2/N2/CO. In an embodiment the transfer of the pattern may be performed using, e.g., a dry etch process, whereby reactive ions are directed towards the APF layer 30 with the overlying second hardmask 32. With the patterned second hardmask layer 32 overlying the APF layer 30, the patterned second hardmask 32 will block the reactive ions, thereby allowing reactions to occur where the APF layer 30 is exposed by the patterned second hardmask layer 32, thereby transferring the pattern of the second hardmask layer 32 to the APF layer 30.

After the APF layer 30 has been patterned, the pattern may be transferred from the APF layer 30 to the first hardmask layer 28. The first hardmask layer 28 may be patterned by a dry chemical etch with a plasma source and an etchant gas. The plasma source may be an inductively coupled plasma (ICR) etch, a transformer coupled plasma (TCP) etch, an electron cyclotron resonance (ECR) etch, a reactive ion etch (RIE), or the like. In the dry chemical etch, reactive ions are directed towards the first hardmask layer 28 with the overlying patterned APF layer 30. With the patterned APF layer 30 overlying the first hardmask layer 28, the patterned APF layer 30 will block the reactive ions, thereby allowing reactions to occur where the first hardmask layer 28 is exposed by the patterned APF layer 30, thereby transferring the pattern of the APF layer 30 to the first hardmask layer 28.

Figure 5:
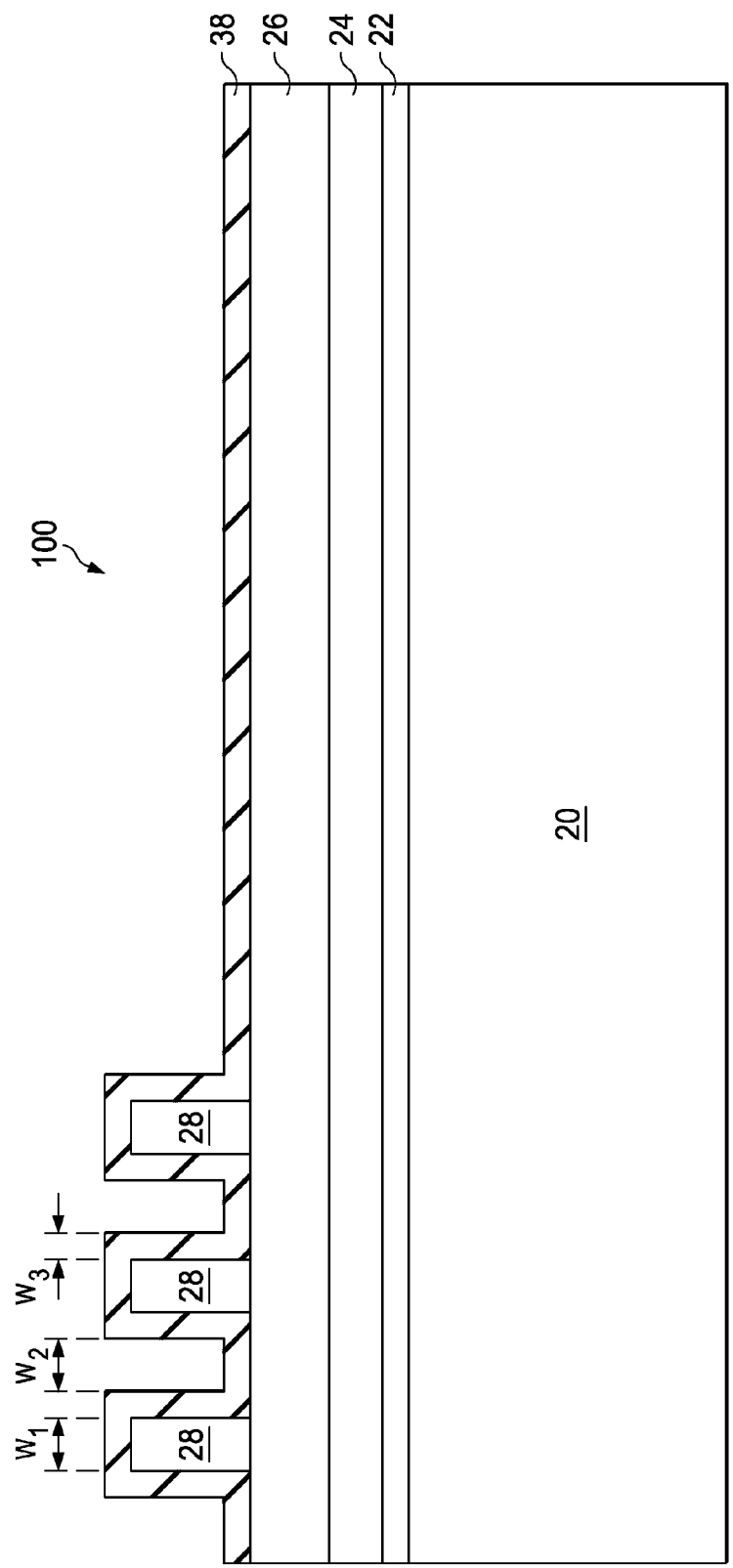
FIG. 5 illustrates the formation of a fourth dielectric in accordance with an embodiment.

FIG. 5 illustrates the formation of a fourth dielectric layer 38 over the third dielectric layer 26 and the first hardmask portions 28 (step 518). In an embodiment, the fourth dielectric layer 38 may be conformally deposited over the third dielectric layer 26 and the first hardmask portions 28 such that the thickness of the fourth dielectric layer 38 on the top surface of the third dielectric layer 26 and the sidewalls of the first hardmask portions 28 is substantially a same thickness. The fourth dielectric layer 38 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The fourth dielectric layer 38 may be deposited through a process such as atomic layer deposition (ALD), CVD, or a spin-on-glass process, although any acceptable process may be utilized to form the fourth dielectric layer 38 to a thickness $W_3$ between about 200 Å to about 300 Å. In some embodiments, the thickness $W_3$ may be designed such that the width $W_1$ is equal to width $W_2$. In an embodiment, the width $W_1$ and the width $W_2$ are between about 10 nm and about 30 nm.

Figure 6:
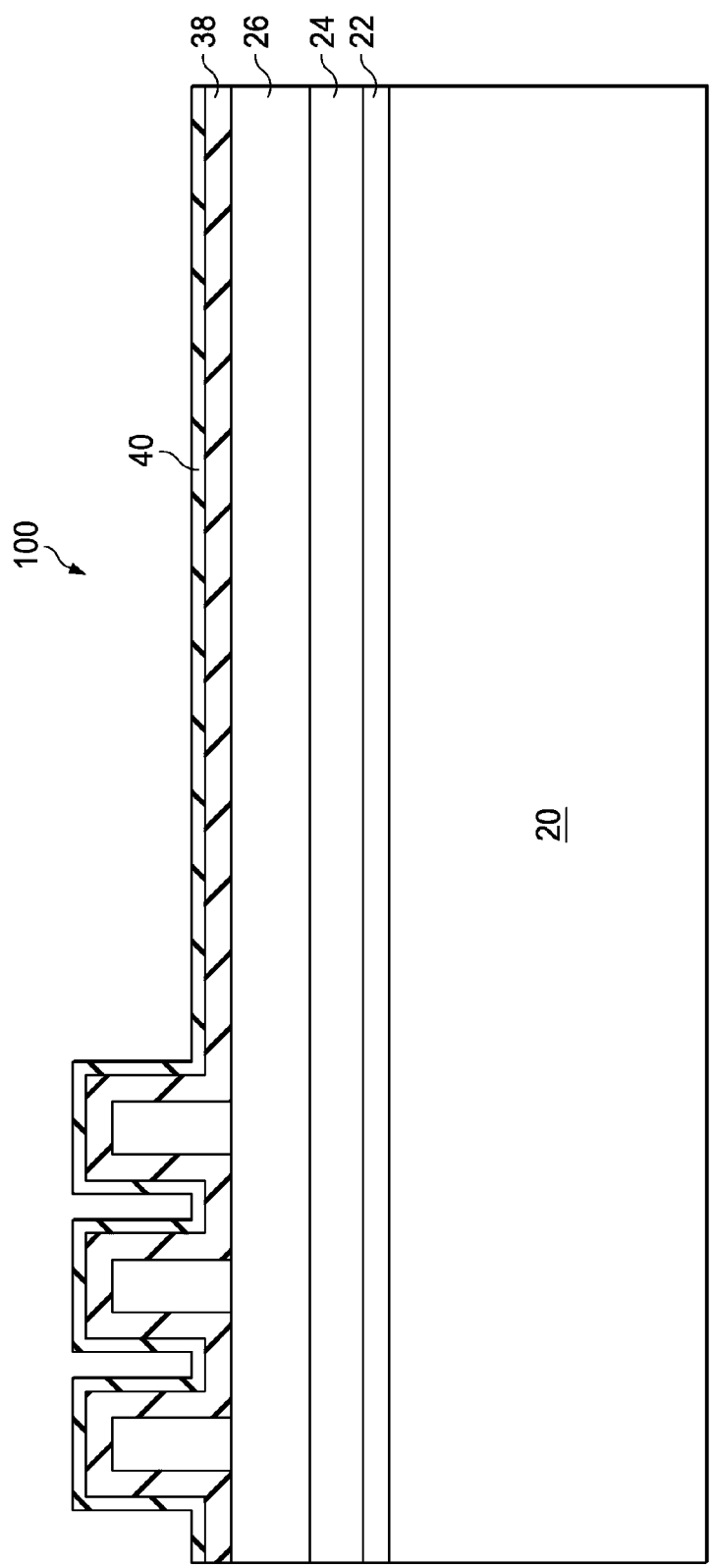
FIG. 6 illustrates the formation of a fifth dielectric layer in accordance with an embodiment.

FIG. 6 illustrates the formation of a fifth dielectric layer 40 on the fourth dielectric layer 38 (step 520). The fifth dielectric layer 40 may be formed by various processes and treatments. In an embodiment, the fifth dielectric layer may be formed a plasma treatment with a plasma source and one or more gases. The plasma source may be an ICR, a TCP, an ECR, an RIE, or the like. In this embodiment, the process for forming the fifth dielectric layer is performing a plasma treatment at a pressure in a range from about 5 mTorr to about 20 mTorr, at a power in a range from about 500 watts to about 2000 watts, with an etching bias in range from about 50 volts to about 300 volts, with a plasma flow including from about 30 standard cubic centimeters per minute (sccm) to about 300 sccm of $O_2$, about 5 sccm to about 30 sccm of $CH_4$, and about 100 sccm to about 200 sccm of Ar.

In an embodiment, the fifth dielectric layer 40 may be formed by performing an oxidation process, such as thermal oxidation, on the fourth dielectric layer 38. In some embodiments, the fifth dielectric layer 40 may be conformally deposited over the fourth dielectric layer 38 such that the thickness of the fifth dielectric layer 40 on the top surfaces and sidewalls of the fourth dielectric layer 38 is substantially a same thickness. The fifth dielectric layer 40 may be made of one or more suitable dielectric materials such as oxide, silicon oxide, silicon oxynitride, a polymer such as polyimide, the like, or a combination thereof.

Figure 7:
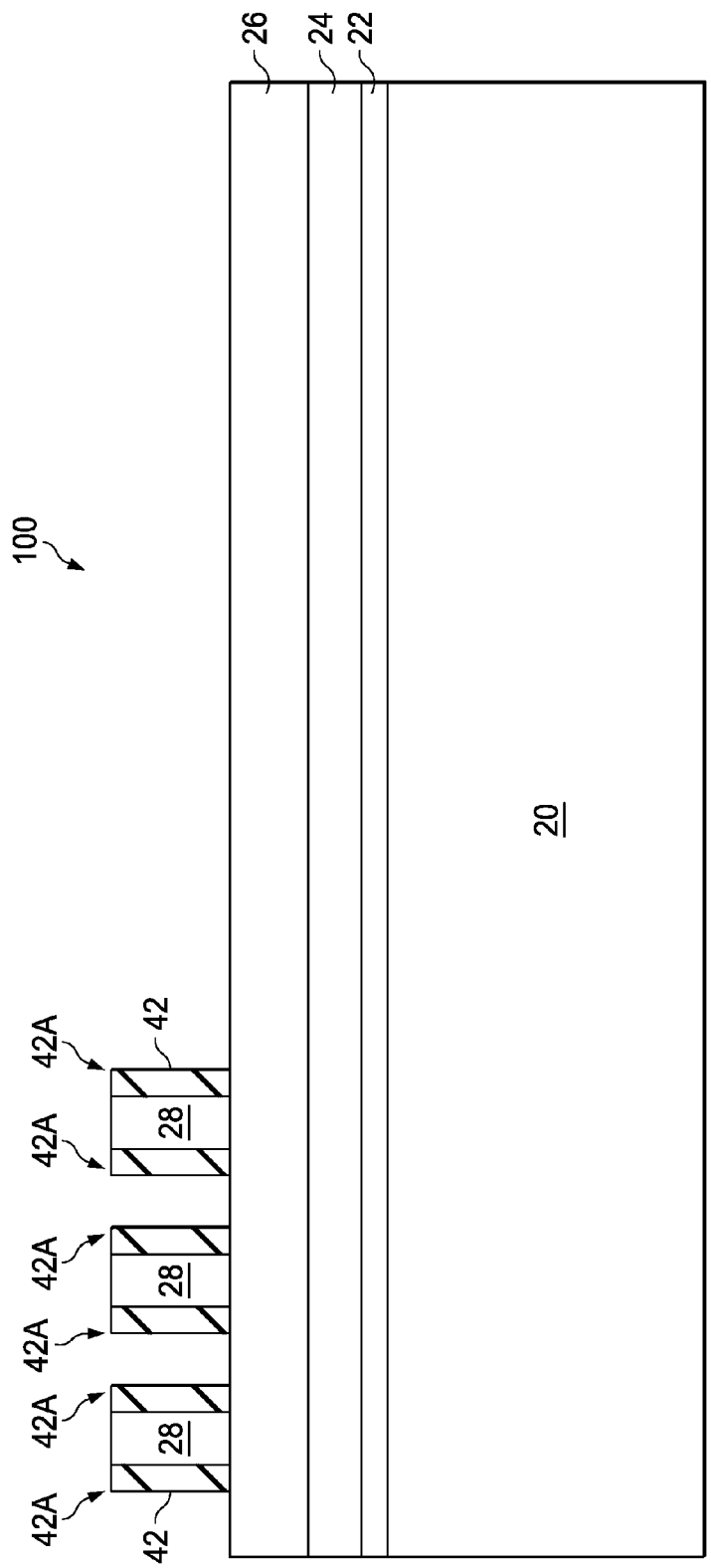
FIG. 7 illustrates a removal of the fifth dielectric layer and a portion of the fourth dielectric layer in accordance with an embodiment.

FIG. 7 illustrates the etching of the fifth dielectric layer 40 and horizontal portions of the fourth dielectric layer 38 (step 522) to expose the first hardmask portions 28 and form fin spacers 42. The presence of the fifth dielectric layer 40 on the fourth dielectric layer 38 keeps the corners 42A (shoulders) of the fin spacers 42 to be substantially square. The first hardmask portions 28 form a mandrel to support the fin spacers 42 and may help to prevent deformation of the fin spacers 42 during this etching step. In some embodiments, the etching of the fifth dielectric layer 40 and the horizontal portions of the fourth dielectric layer 38 may be a multiple etch process comprising a plasma source and an etchant gas, and the plasma source may be an ICP etch, a TCP etch, an ECR etch, an RIE, or the like. In these embodiments, a main etch is performed by a plasma etch at a pressure in a range from about 5 mTorr to about 20 mTorr, at a power in a range from about 500 watts to about 1500 watts, with an etching bias in range from about 50 volts to about 400 volts, with a plasma flow including from about 50 sccm to about 200 sccm of HBr, about 50 sccm to about 300 sccm of $CF_4$, about 5 sccm to about 20 sccm of $O_2$, and about 100 sccm to about 500 sccm of He. Next, in these embodiments, an over-etch performed by a plasma etch at a pressure in a range from about 10 mTorr to about 60 mTorr, at a power in a range from about 300 watts to about 800 watts, with an etching bias in range from about 100 volts to about 500 volts, with a plasma flow including from about 50 sccm to about 200 sccm of $O_2$, about 50 sccm to about 300 sccm of $CH_3F$, and about 100 sccm to about 400 sccm of He.

Figure 8:
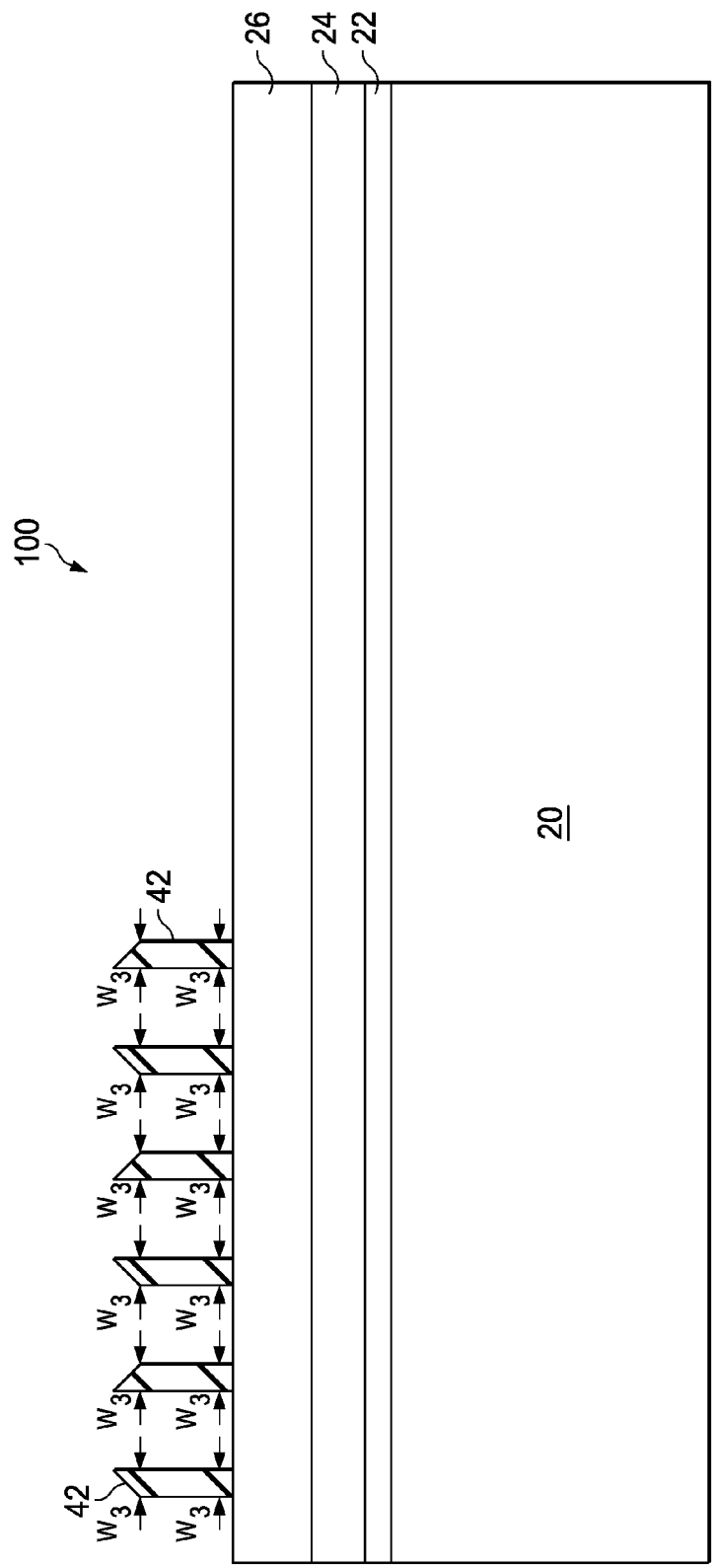
FIG. 8 illustrates the removal of the first hardmask layer in accordance with an embodiment.

After the fifth dielectric layer 40 and the fourth dielectric layer 38 are etched, the first hardmask portions 28 may be removed (step 524) as illustrated in FIG. 8. After the removal of the first hardmask portions 28, the top surfaces of the fin spacers 42 may be angled or rounded. The angled or rounded surfaces face in a direction opposite of the location of the removed first hardmask portions 28. The square corners 42A of the fin spacers 42 (see FIG. 7) allows the fin spacers 42 to have a same width $W_3$ along the portions of fin spacer 42 with sidewalls that are substantially orthogonal to the top surface of the substrate 20. In some embodiments, the removal of the first hardmask portions 28 may be a multiple etch process. In these embodiments, a first etch is a dry chemical etch process comprising a plasma source and an etchant gas, and the plasma source may be an ICP etch, a TCP etch, an ECR etch, an RIE, or the like. This first etch may be performed by a plasma etch at a pressure in a range from about 10 mTorr to about 100 mTorr, at a power in a range from about 300 watts to about 1000 watts, with an etching bias in range from about 40 volts to about 200 volts, with a plasma flow including from about 50 sccm to about 200 sccm of $O_2$. Next, in these embodiments, a wet etch may be performed to finish removing the first hardmask portions 28 from between the fin spacers 42. This wet etch process may comprise a diluted hydrofluoric acid (DHF) for a time between about 10 seconds and about 30 seconds and $NH_4OH$ for a time between about 100 seconds and about 500 seconds. In some embodiments, the removal of the first hardmask portions 28 may comprise a wet etch with an etchant comprising tetramethylammonium hydroxide (TMAH or TMAOH).

The width $W_1$ defines the width between a first pair of fin spacers 42 (see FIG. 5), and will later define a first space between a pair of adjacent fins 50. The width $W_2$ defines the width between a pair of fin spacers 42 (see FIG. 5), and will later define the width of a second space between a pair of adjacent fins 50, the second space and the first space alternating between pairs of fins 50 (see FIG. 13). The width $W_3$ defines the width of a fin spacer 42 and will later define the width of a fin 50 (see FIG. 5).

Figure 9:
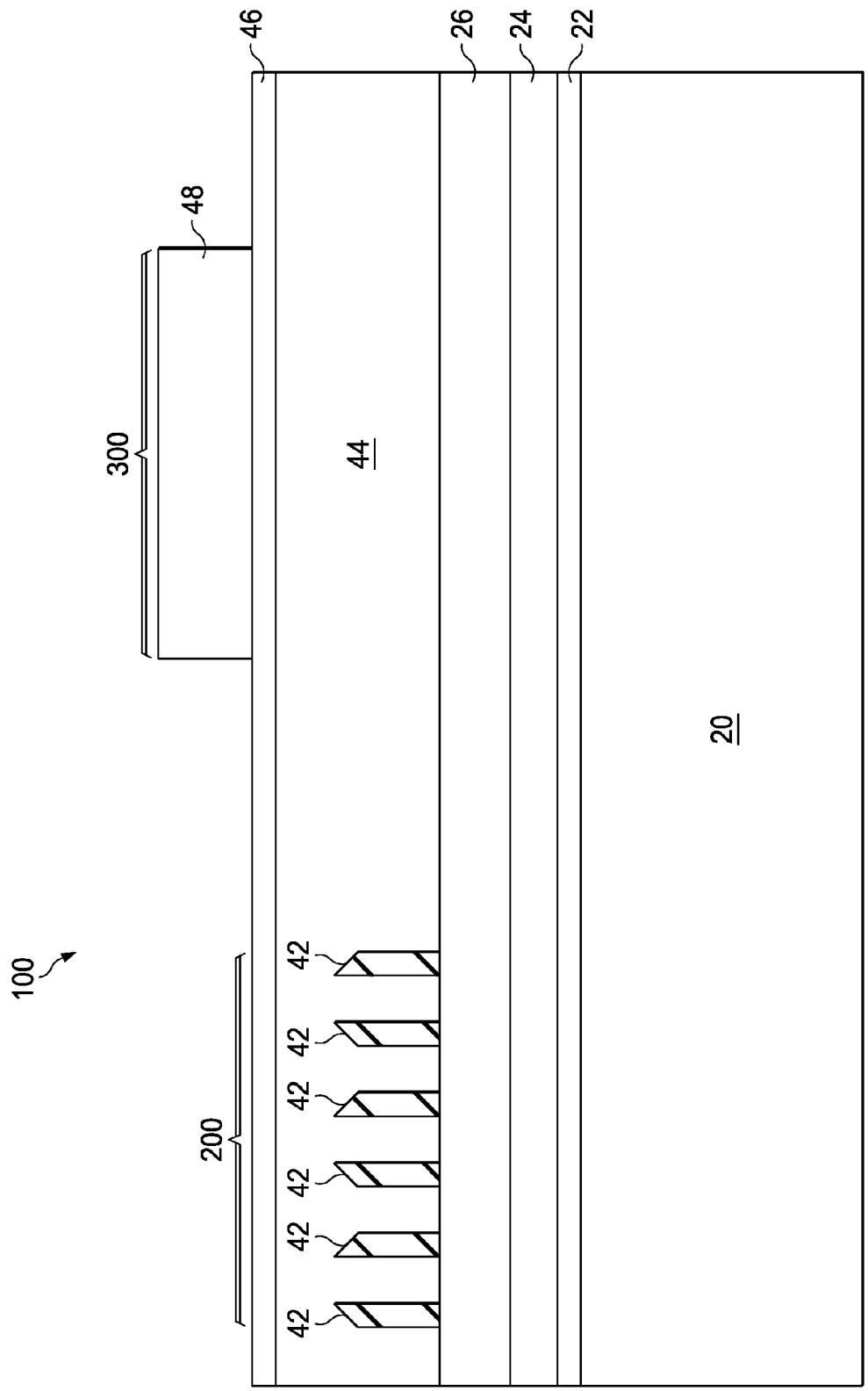
FIG. 9 illustrates the formation of a second BARC layer, a sixth dielectric layer, and a second photoresist in accordance with an embodiment.

FIG. 9 illustrates the formation of a second BARC layer 44, a sixth dielectric layer 46 and a second photoresist 48 over the fin spacers 42 and the third dielectric layer 26. The fin spacers 42 comprise a first active region 200 and the second photoresist 48 is used to pattern a second active region 300. The second active region 300 may comprise another FinFET device, other active devices, passive devices, the like, or a combination thereof. The second BARC layer 44 may be formed of similar materials and similar processes as the first BARC layer 34, although the first BARC layer 34 and the second BARC layer 44 need not be the same material. In an embodiment, the second BARC layer 44 may be formed to a thickness between about 1800 Å to about 3000 Å.

The sixth dielectric layer 46 may be formed over the second BARC layer 44. The sixth dielectric layer 46 may be formed of similar materials and similar processes as the first dielectric layer 22, the second dielectric layer 24, the third dielectric layer 26, and the fourth dielectric layer 38, although the first dielectric layer 22, the second dielectric layer 24, the third dielectric layer 26, the fourth dielectric layer 38, and the sixth dielectric layer 46 need not be the same material. In an embodiment, the sixth dielectric layer 46 may be formed to a thickness between about 400 Å to about 600 Å.

The second photoresist 48 may be formed of similar materials and similar processes as the first photoresist 36, although the first photoresist 36 and the second photoresist 48 need not be the same material. The second photoresist 48 may then be developed, and portions of the second photoresist 48 may be removed, exposing a surface of the sixth dielectric layer 46.

Figure 10:
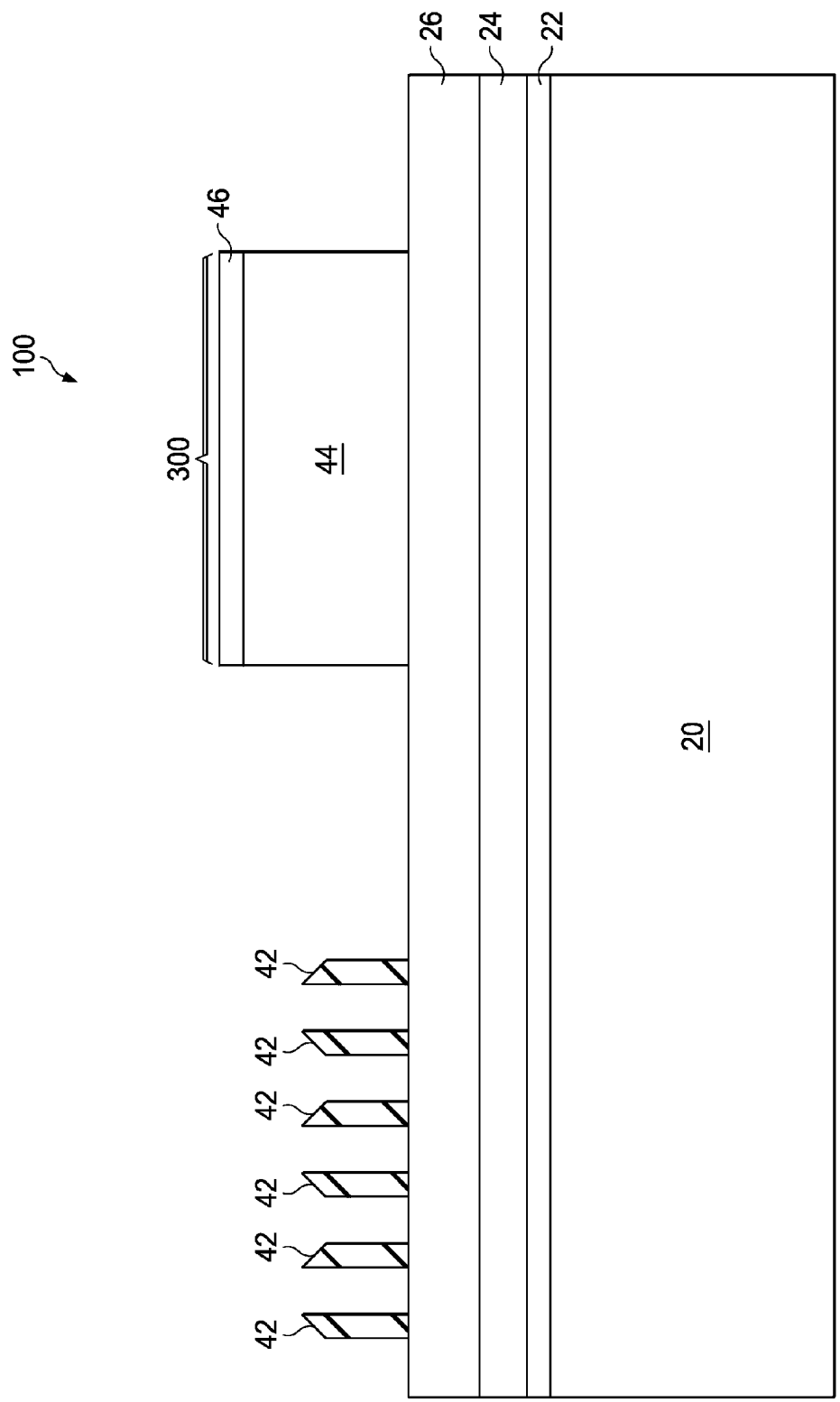
FIG. 10 illustrates the patterning of the sixth dielectric layer and the second BARC layer in accordance with an embodiment.

After developing and removing a portion of the second photoresist 48, an etch step is further performed into the sixth dielectric layer 46 to remove the exposed portions, thereby patterning the sixth dielectric layer 46 as illustrated in FIG. 10. Once the sixth dielectric layer 46 has been patterned, the pattern may be transferred to the second BARC layer 44 (step 526), thereby exposing the fin spacers 42 and the third dielectric layer 26.

Figure 11:
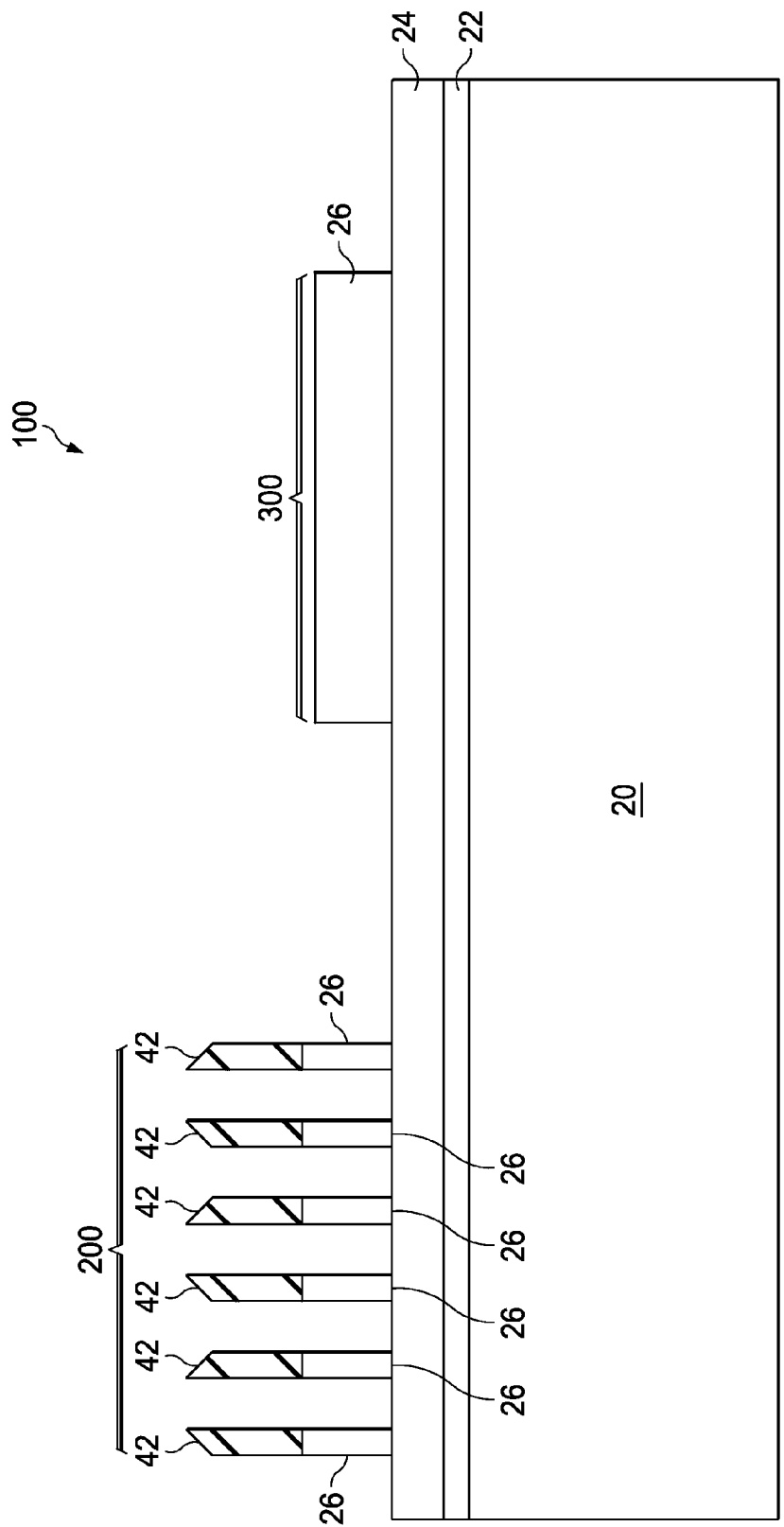
FIG. 11 illustrates a patterning of the third dielectric layer in accordance with an embodiment.

FIG. 11 illustrates the removal of the exposed portions of the third dielectric layer 26, thereby transferring the pattern of the fin spacers 42 and the second active region 300 to the third dielectric layer 26 (step 528). The etching of the third dielectric layer 26 may be performed by, e.g., a dry etch, with etchant gas comprising $SF_6$, $CF_4$, $CHF_3$, He, Ar, the like, or a combination thereof.

Figure 12:
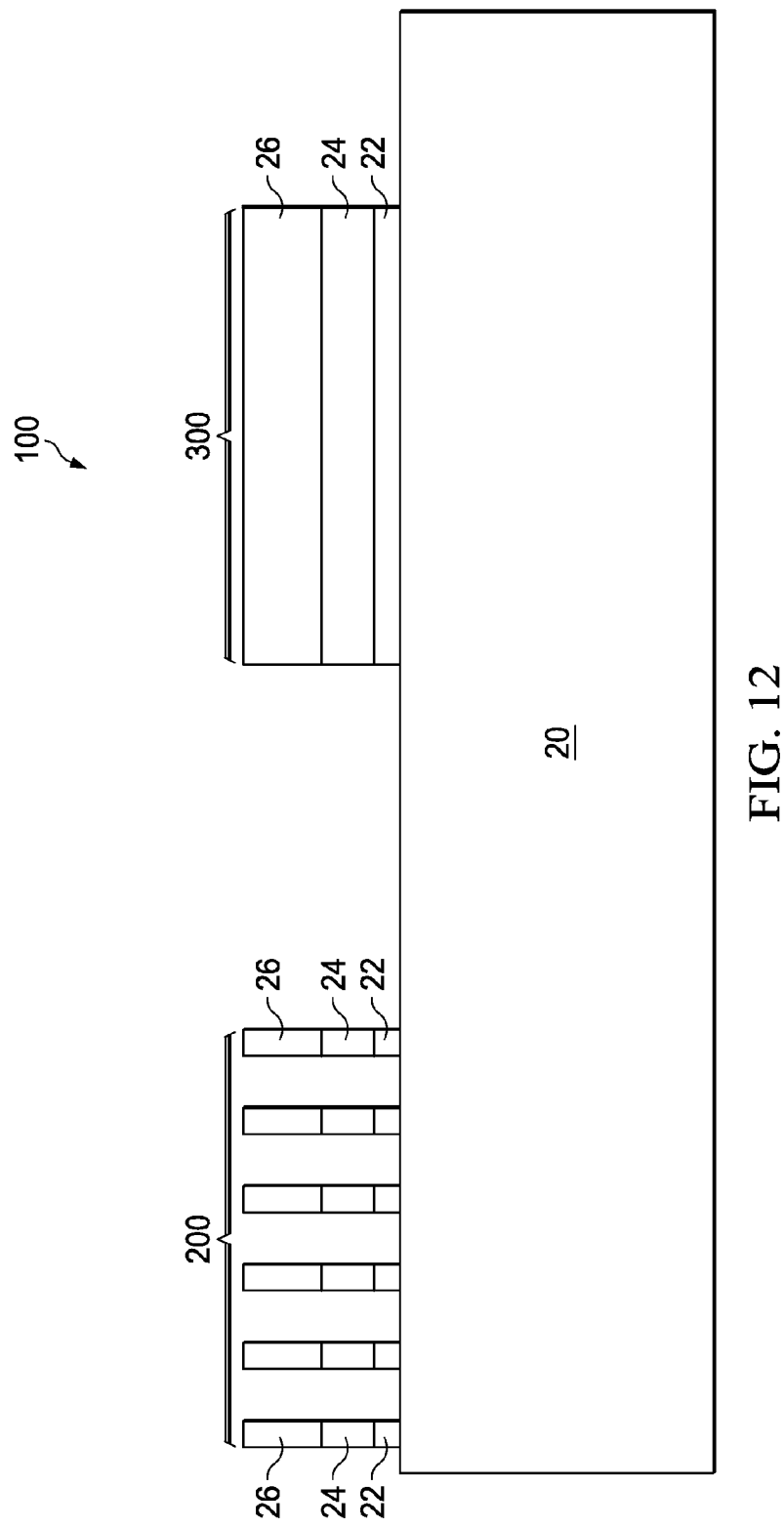
FIG. 12 illustrates a patterning of the second dielectric layer and the first dielectric layer in accordance with an embodiment.

FIG. 12 illustrates the removal of the exposed portions of the second dielectric layer 24 and the first dielectric layer 22 (step 528), thereby transferring the pattern of the fin spacers 42 and the second active region 300 to the second dielectric layer 24 and the first dielectric layer 22. The etching of the second dielectric layer 24 and the first dielectric layer 22 may be performed by, e.g., a dry etch, with etchant gas comprising $SF_6$, $CF_4$, $CHF_3$, the like, or a combination thereof.

Figure 13:
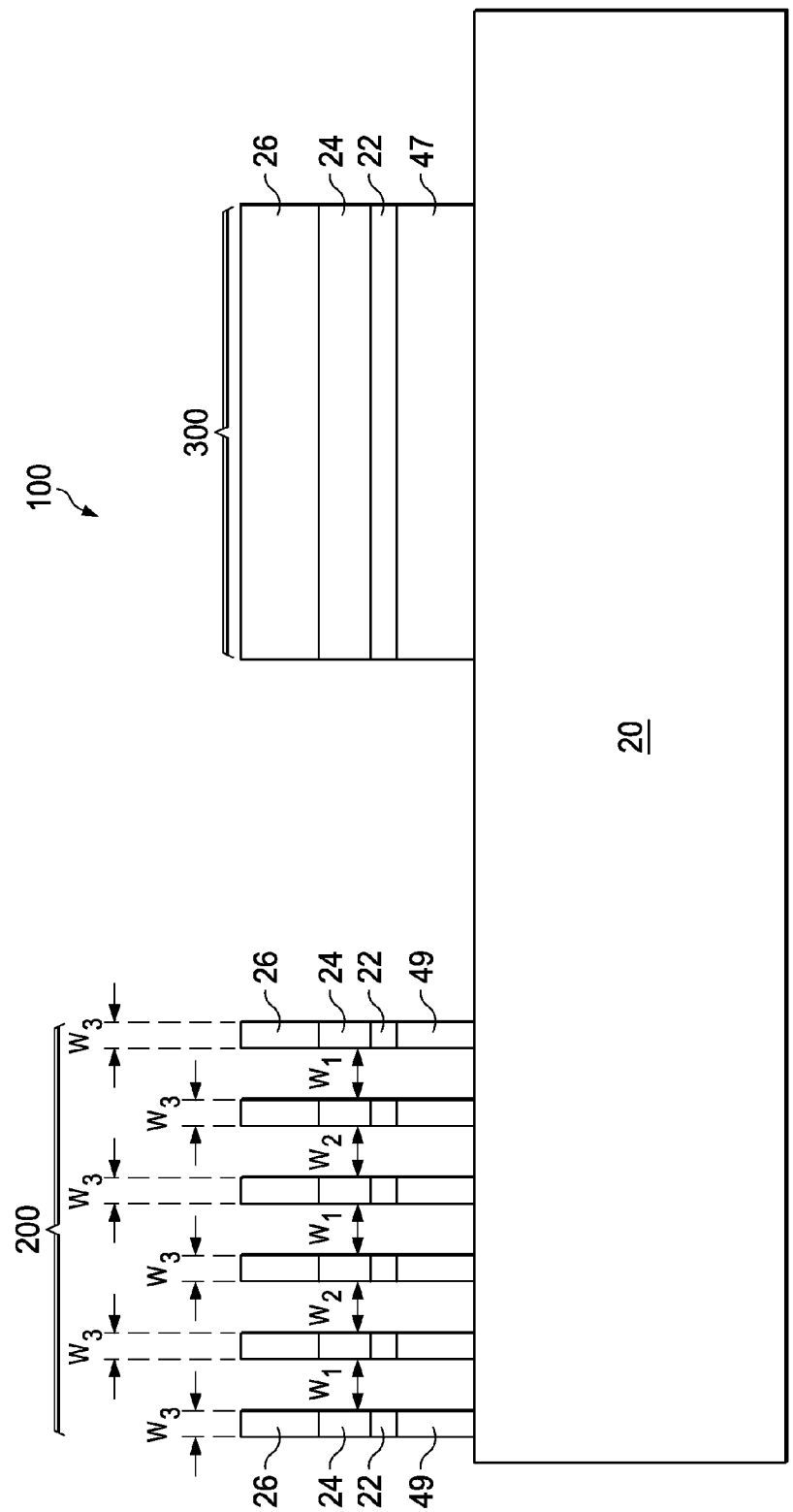
FIG. 13 illustrates a first patterning of the substrate 20 in accordance with an embodiment.

FIG. 13 illustrates the transferring of the pattern to the substrate 20 (step 530), thereby forming semiconductor strips 49 extending from the substrate 20 in the first active region 200 and a semiconductor device 47 in the second active region 300. The semiconductor strips 49 may have sidewalls substantially orthogonal to a major surface of the substrate 20. The spacing between the semiconductor strips 49 $W_1$ and $W_2$ are defined by the widths $W_1$ and $W_2$ between the fin spacers 42 (see FIGS. 5 and 8). In some embodiments, the width $W_1$ is substantially equal to the width $W_2$. In an embodiment, the fin pitch (fin with+fin spacing) is from about 70 nm to about 150 nm.

Figure 14:
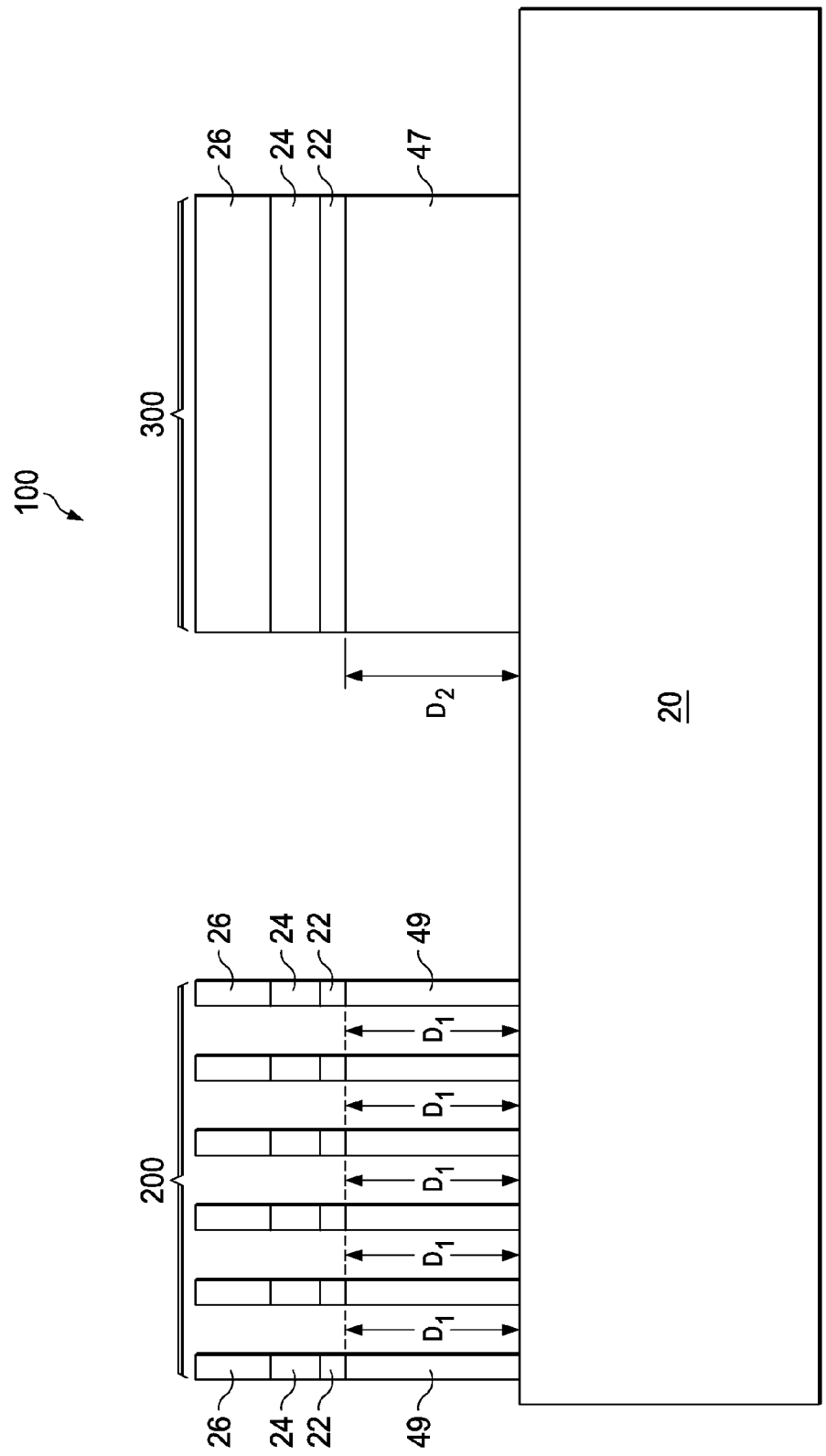
FIG. 14 illustrates a second patterning of the substrate 20 in accordance with an embodiment.

FIG. 14 illustrates further etching the substrate 20 (step 530) to form the semiconductor strips 49 to a depth $D_1$ and the semiconductor device 47 to a depth $D_2$. In an embodiment, the semiconductor strip 49 is vertical from the first dielectric layer 22 towards the substrate 20 for a distance from about 200 Å to about 500 Å. The depth $D_1$ may be between about 1200 Å and about 2500 Å, and the depth $D_2$ may be between about 1200 Å and about 2500 Å. In some embodiments, the depths between the semiconductor strips 49 may be substantially equal. In some embodiments, the depths $D_1$ and $D_2$ may be substantially equal. There may be adjustable control loading for the dimensions in first active region 200 and the second active region 300. For example, in an embodiment for the depths $D_1$ and $D_2$ may be different by up to about 50 Å due to the adjustable control loading.

The patterning and etch steps described above may be performed in an etching chamber. In some embodiments, the etching chamber may be from Lam Research Corp., Applied Materials, Hitachi-Hitech, Tokyo Electron Limited (TEL), or the like. The chamber may have a chiller temperature in a range from 20° C. to about 30° C. and a chamber wall temperature in a range from about 50° C. to about 80° C. The chamber may comprise an electronic static chuck temperature with a four-zone distribution in a range from about 40° C. to about 80° C. However, as one of ordinary skill in the art would understand, any suitable etching chamber vendor or conditions may be used.

FIG. 15 illustrates the formation of a seventh dielectric layer 51 over the semiconductor substrate, thereby forming fins 50 extending above a top surface of the seventh dielectric layer 51 and the formation of a gate 52 over the fins 50 (step 532). The seventh dielectric layer 51 may be formed of similar materials and similar processes as the first dielectric layer 22, the second dielectric layer 24, the third dielectric layer 26, the fourth dielectric layer 38, and the sixth dielectric layer 46, although the first dielectric layer 22, the second dielectric layer 24, the third dielectric layer 26, the fourth dielectric layer 38, the sixth dielectric layer 46, and the seventh dielectric layer 51 need not be the same material.

The seventh dielectric layer 51 may be deposited over the semiconductor strips 49 such that the top surface of the seventh dielectric layer 51 may extend above the top surfaces of the semiconductor strips 49. In this embodiment, the seventh dielectric layer 51 may be thinned to below the level of the tops of the semiconductor strips 49. The seventh dielectric layer 51 may be thinned back in a variety of ways. In one embodiment, this is a multi-step process with the first step involving a chemical mechanical polishing (CMP), in which the seventh dielectric layer 51 is reacted and then ground away using an abrasive. This process may continue until the tops of the semiconductor strips 49 are exposed. The next step of thinning the seventh dielectric layer 51 below the tops of the semiconductor strips 49 may be performed in a variety of ways. One such way is by a DHF treatment or a vapor hydrofluoric acid (VHF) treatment for a suitable time. In another embodiment, the CMP process step may be skipped and the seventh dielectric layer 51 may be selectively thinned back without removing the semiconductor strips 49. This selective thinning may be performed by the DHF treatment or the VHF treatment described above.

After the formation of the seventh dielectric layer 51, the gate 52 may be formed over the fins 50. The gate 52 may include a gate dielectric layer (not shown) and gate spacers (not shown). The gate dielectric layer may be formed by thermal oxidation, CVD, sputtering, or any other methods known and used in the art for forming a gate dielectric. In other embodiments, the gate dielectric layer includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

A gate electrode layer (not shown) may be formed over the gate dielectric layer. The gate electrode layer may comprise a conductive material and may be selected from a group comprising polycrystalline-silicon (poly-Si), poly-crystalline silicon-germanium (poly-SiGe), metallic nitrides, metallic silicides, metallic oxides, and metals. The gate electrode layer may be deposited by CVD, sputter deposition, or other techniques known and used in the art for depositing conductive materials. The top surface of the gate electrode layer usually has a non-planar top surface, and may be planarized prior to patterning of the gate electrode layer or gate etch. Ions may or may not be introduced into the gate electrode layer at this point. Ions may be introduced, for example, by ion implantation techniques. The gate electrode layer and the gate dielectric layer may be patterned to form the gate 52. The gate patterning process may be accomplished by depositing mask material (not shown) such as photoresist or silicon oxide over the gate electrode layer. The mask material is then patterned and the gate electrode layer is etched in accordance with the pattern.

After the formation of the gate 52, source and drain regions (not shown) may be formed on the fins 50. The source and drain regions may be doped by performing implanting process to implant appropriate dopants to complement the dopants in the fins 50. In another embodiment, the source and drain regions may be formed by forming recesses (not shown) in fins 50 and epitaxially growing material in the recesses. The source and drain regions may be doped either through an implantation method as discussed above, or else by in-situ doping as the material is grown. In an embodiment, a continuous conductive layer may overly the fins 50 in each of the source regions to form a single source region. Further, a continuous conductive layer may overly the four fins 50 in each of the drain regions in each of the drain regions to form a single drain region.

Gate spacers (not shown) may be formed on opposite sides of the gates 52. The gate spacers are typically formed by blanket depositing a spacer layer (not shown) on the previously formed structure. The spacer layer may comprise SiN, oxynitride, SiC, SiON, oxide, the like, or a combination thereof and may be formed by methods utilized to form such a layer, such as CVD, plasma enhanced CVD, sputter, and other methods known in the art. The gate spacers are then patterned, preferably by anisotropically etching to remove the spacer layer from the horizontal surfaces of the structure.

In another embodiment, the source and drain regions may comprise a lightly doped region and a heavily doped region. In this embodiment, before the gate spacers are formed, the source and drain regions may be lightly doped. After the gate spacers are formed, the source and drain regions may then be heavily doped. This forms lightly doped regions and heavily doped regions. The lightly doped regions are primarily underneath the gate spacers while the heavily doped regions are outside of the gate spacers along the fins 50.

After the formation of the gate 52, subsequent processing of the FinFET device 100 may include formation of a contact etch stop layer (CESL), an inter-layer dielectric (ILD), and contacts in the ILD to the source and drain regions and the gate 52. Further contacts may be made in the ILD to the semiconductor device 47 in the second active region 300.

It has been found that forming the fifth dielectric layer 40 on the fourth dielectric layer 38 allows the fin spacers 42 to have square corners (shoulders). The square corners 42A of the fin spacers 42 allow the fin spacers 42 to have a same width from the top to the bottom of the fin spacer 42 which prevents bowling of the subsequently formed fins 50 and the spacing and depth between the fins 50 are better controlled and may be substantially equal between all of the fins 50. Also, the fin spacers 42 having the same width provides a larger effective fin spacer height.

Further, by using a wet etch process to finish removing the first hardmask portions 28 (mandrel), there is no concern of damage from a plasma dry etch process on the underlying structures. The wet etch prevents the recessing of the third dielectric layer 26 that may be caused by a dry etch process. Also, the wet etch process is a lower cost and allows a higher throughput (wafers per hour) than a dry etch process.

An embodiment is a method of forming a semiconductor device, the method including forming a first dielectric layer over a substrate, forming a first hardmask layer on the first dielectric layer, and patterning the first hardmask layer to form a first hardmask portion with a first width. The method further includes forming a second dielectric layer on the first dielectric layer and the first hardmask portion, forming a third dielectric layer on the second dielectric layer, and etching the third dielectric layer and a portion of the second dielectric layer to form a first and second spacer on opposite sides of the first hardmask portion.

Another embodiment is a method of forming a FinFET device, the method including forming a first dielectric layer over a substrate, forming a first hardmask layer on the first dielectric layer, patterning the first hardmask layer into a first plurality of strips, at least two of the first plurality of strips having a first width, and conformally depositing a second dielectric layer on the first dielectric layer and the first plurality of strips. The method further includes conformally forming a third dielectric layer on the second dielectric layer, removing the third dielectric layer, and removing the horizontal surfaces of the second dielectric layer, wherein top surfaces of the first plurality of strips are exposed, thereby forming a second plurality of strips of the second dielectric layer, the second plurality of strips having a second width.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
   forming a first dielectric layer over a substrate
   forming a first hardmask layer on the first dielectric layer;
   patterning the first hardmask layer to form a first hardmask portion with a first width;
   after patterning the first hardmask layer to form the first hardmask portion, forming a second dielectric layer on the first dielectric layer and on sidewalls of the first hardmask portion and a top surface of the first hardmask portion;
   forming a third dielectric layer on the second dielectric layer, the third dielectric layer being formed by treating the second dielectric layer; and
   etching the third dielectric layer and a portion of the second dielectric layer to form a first spacer and a second spacer on opposite sides of the first hardmask portion.

2. The method of claim 1, wherein the etching the third dielectric layer and the portion of the second dielectric layer further comprises:
   removing the third dielectric layer; and
   removing horizontal portions of the second dielectric layer, wherein top surfaces of the first hardmask portion and the first dielectric layer are exposed.

3. The method of claim 2, wherein the removing the third dielectric layer and the removing the horizontal portions of the second dielectric layer further comprises:
   a first plasma etch step with first etchant gas comprising HBr, $CF_4$, $O_2$, and He; and a second plasma etch step with a second etchant gas comprising $O_2$, $CH_3F$, and He.

4. The method of claim 1 further comprising:
removing the first hardmask portion, wherein sidewalls of the first spacer and the second spacer are orthogonal to a top surface of the substrate.

5. The method claim 4, wherein the removing the first hardmask portion further comprises performing a wet etch process comprising a diluted hydrofluoric acid (DHF) for a time between about 10 seconds and about 30 seconds and $NH_4OH$ for a time between about 100 seconds and about 500 seconds.

6. The method of claim 1, wherein the forming the second dielectric layer further comprises conformally depositing the second dielectric layer over the first dielectric layer and the first hardmask portion.

7. The method of claim 1, wherein the third dielectric layer comprises a polymer layer over the second dielectric layer.

8. The method of claim 1, wherein the third dielectric layer is formed by performing an oxidation process on the second dielectric layer.

9. The method of claim 1, wherein the patterning the first hardmask layer further comprises:
forming an advanced patterning film (APF) layer over the first hardmask layer;
forming a fourth dielectric layer over the APF layer;
forming a photoresist over the third dielectric layer;
patterning the photoresist to form a first photoresist portion with the first width;
patterning the fourth dielectric layer to form a first portion of the fourth dielectric layer with the first width;
patterning the APF layer to form a first portion of the APF layer with the first width; and
transferring the pattern to the first hardmask layer.

10. The method of claim 1 further comprising:
etching the first dielectric layer, wherein remaining portions of the first dielectric layer are aligned with the first and second spacers; and
etching the substrate to form fins, wherein the fins are substantially aligned with the first and second spacers, and wherein the fins are separated by the first width.

11. The method of claim 10 further comprising:
forming a gate dielectric layer over the fins;
forming a gate over the gate dielectric layer; and
forming source regions and drain regions on the fins, wherein the gate is laterally between the source regions and drain regions.

12. A method of forming a FinFET device, the method comprising:
forming a first dielectric layer over a substrate;
forming a first hardmask layer on the first dielectric layer;
patterning the first hardmask layer into a first plurality of strips, at least two of the first plurality of strips having a first width;
after the patterning the first hardmask layer in the first plurality of strips, conformally depositing a second dielectric layer on the first dielectric layer and on sidewalls of the first plurality of strips;
conformally forming a third dielectric layer on the second dielectric layer, the third dielectric layer being formed by performing a treatment on the second dielectric layer;
removing the third dielectric layer; and
removing horizontal surfaces of the second dielectric layer, wherein top surfaces of the first plurality of strips are exposed, thereby forming a second plurality of strips of the second dielectric layer, the second plurality of strips having a second width.

13. The method of claim 12, wherein the third dielectric layer comprises a polymer layer over the second dielectric layer.

14. The method of claim 12, wherein the conformally forming the third dielectric layer further comprises performing a plasma treatment process on the second dielectric layer.

15. The method of claim 12, wherein the second plurality of strips are adjoining the first plurality of strips.

16. The method of claim 12 further comprising forming a plurality of fins having the second width, wherein a width between adjacent fins is the first width.

17. The method of claim 16, wherein the forming the plurality of fins further comprises:
removing the first plurality of strips;
etching the first dielectric layer, wherein remaining portions of the first dielectric layer are aligned with the second plurality of strips; and
etching the substrate, wherein the fins are aligned with the remaining portions of the first dielectric layer.

18. The method of claim 17, wherein the removing the first plurality of strips further comprises performing a wet etch process comprising a diluted hydrofluoric acid (DHF) for a time between about 10 seconds and about 30 seconds and $NH_4OH$ for a time between about 100 seconds and about 500 seconds.

19. The method of claim 16, further comprising:
forming a gate dielectric layer over the fins;
forming a gate over the gate dielectric layer; and
forming source regions and drain regions on the fins, wherein the gate is laterally between the source regions and drain regions.

20. The method of claim 12, wherein the first plurality of strips comprises poly-silicon and the second plurality of strips comprises silicon nitride.

21. The method of claim 1, wherein the third dielectric layer is formed by performing a plasma treatment process on the second dielectric layer.

22. The method of claim 12, wherein the third dielectric layer is formed by performing an oxidation process on the second dielectric layer.

* * * * *